United States Patent [19]
Hordeski

[11] 4,011,448
[45] Mar. 8, 1977

[54] LINEAR SHAFT ENCODER

[76] Inventor: Michael F. Hordeski, 14831 Kitterman Drive, Silverado, Calif. 92676

[22] Filed: Aug. 8, 1975

[21] Appl. No.: 602,990

[52] U.S. Cl. .......................... 250/237 R; 356/170
[51] Int. Cl.² ........................................ H01J 3/14
[58] Field of Search .......... 250/568, 569, 566, 578, 250/234, 231 R, 232, 237 R, 237 G; 356/169, 170; 340/347 P

[56] References Cited
UNITED STATES PATENTS

| | | | |
|---|---|---|---|
| 3,093,778 | 6/1963 | Tidwell | 250/231 X |
| 3,358,202 | 12/1967 | Pabst et al. | 250/231 R X |
| 3,387,139 | 6/1968 | Gerard et al. | 250/237 R X |
| 3,609,382 | 9/1971 | Moore et al. | 250/232 |
| 3,633,038 | 1/1972 | Falk | 250/231 R |
| 3,742,233 | 6/1973 | Gorgeni et al. | 250/231 R |

*Primary Examiner*—David C. Nelms
*Attorney, Agent, or Firm*—Knobbe, Martens, Olson, Hubbard & Bear

[57] ABSTRACT

An electronic digital linear shaft encoder which is totally self-contained and readily adaptable to a variety of different equipment using different mounting configurations is disclosed. This encoder mechanism provides an accurate, reliable alignment system within the self-contained unit for aligning a transparent, coded, dimension measuring grid within a photooptical system for assuring that, regardless of the alignment of the equipment being measured or the alignment of the self-contained encoder unit on this equipment, proper alignment will be maintained between the measurement grid and the photooptical system to avoid erroneous output signals and thereby assure reliable performance of the encoder unit.

18 Claims, 4 Drawing Figures

LINEAR SHAFT ENCODER

BACKGROUND OF THE DISCLOSURE

This invention relates generally to digital encoding apparatus and more particularly to linear digital shaft encoders for use in measuring the relative movement of two parts of a mechanical assembly.

Digital shaft encoders have commonly been used in the prior art, but such units are almost exclusively rotary encoding units which measure the degree of revolution of a shaft by using a transparent disc mounted to rotate with the shaft, the disc passing between the elements of a photooptical system for sensing light and dark areas on the transparent disc. Such encoders are most typically included as an element in the overall machine design so that the encoding disc can be placed upon a shaft which is properly aligned within the machinery. In such installations, alignment is not a significant problem. Moreover, it is well recognized in the encoder art that, assuming that the rotating shaft is straight, alignment problems do not occur, since the shaft will always rotate about its own axis and the photooptical system need only be rigidly mounted relative this fixed axis to assure alignment.

Even with rotary shaft encoders which are not designed as a part of the overall equipment but are added onto a rotating shaft, it is a simple matter to set a rotating shaft within the encoder unit within bushings and to use a coupling to connect this shaft to the main rotating shaft, the bushings within the self-contained rotary digital encoder assuring alignment of an enclosed rotating transparent disc and a photooptical system.

Much more severe difficulties have been incurred in the prior art, however, in the field of linear shaft encoders whereby the linear relative distance between a pair of machine elements is to be monitored. Because of severe alignment problems encountered in such encoders, the prior art has generally taken two diverse approaches, neither of which is entirely satisfactory. The first approach commonly utilized in the prior art is to measure such linear dimensions using a rotary encoder turned by a lead screw. Thus, the linear dimension, through mechanical linkages, is transformed into a rotary motion which is then measured. While, as discussed above, such rotary encoders do not suffer the alignment dificulties of linear encoders, the inaccuracies which result in this type of linear encoding system are substantial. Thus, for example, the lead screw mechanism may have substantial backlash which increases the error of the monitoring system. In order to overcome such backlash, fairly complex mechanical arrangements are required which increase the cost of the encoder system.

The second approach taken in the prior art to monitor linear travel of machine elements has been the direct mounting of a transparent sheet or other photooptical element with distance gradations or codes marked thereon on a first mechanical element of the machine. A photooptical sensing system is then mounted on a second portion of the overall machine and is used to sense motion of the transparent sheet. Thus, the alignment of the machine elements themselves is utilized to assure alignment between the elements within the linear encoder. This approach is not satisfactory for adding an encoding element to an existing machine or for reducing the cost of the encoding element by manufacturing it as a stand-alone item since the encoder requires a unique mechanical configuration for each pair of machine elements.

SUMMARY OF THE INVENTION

The present invention alleviates these and other difficulties encountered in prior art linear digital encoders by providing a stand-alone, self-aligning linear encoding mechanism. This mechanism may be attached to a first, typically stationary, machine element. A connecting rod extending from the encoder element is attached to a moving machine element whose position is to be monitored. The particular alignment of the two machine elements is not critical, since the connecting linkage extending from the encoder unit is aligned on a track within the encoder. The transparent photooptical measuring element is attached to the rod within the encoder element and is maintained in an aligned configuration by the alignment track within the encoder. The rod extending from the encoder for connection to the moving machine element may be made somewhat flexible so that, even if the encoder element and moving element of the machine are somewhat misaligned, the transparent photooptical element may remain aligned with the photooptical sensing system throughout the travel of the moving machine elements.

More specifically, the present invention includes a plurality of light emitters spaced from a corresponding plurality of light sensors, all stationarily mounted within the encoder chassis. This encoder chassis, in addition, supports a rigid track member used for aligning the moving elements of the photooptical system.

A cooperating guide member interengages with the rigidly mounted track member and carries a coded transparent photooptical element which slides between the light emitters and light sensors to interfere with light transmission between these elements in a coded fashion, resulting in a digital output signal indicative of the relative position of the machine tool elements. The moving guide additionally carries an extending rod which passes through an aperture in the encoder chassis for attachment to the moving machine element. This rod is made somewhat flexible so that the photooptical members remain in alignment regardless of misalignment of the machine element to which the exposed end of the connecting rod is attached.

These and other features of the present invention may best be understood through a reference to the drawings in which.

DETAILED DESCRIPTION OF THE PREFERRED EMBODIMENT

Figure 1:
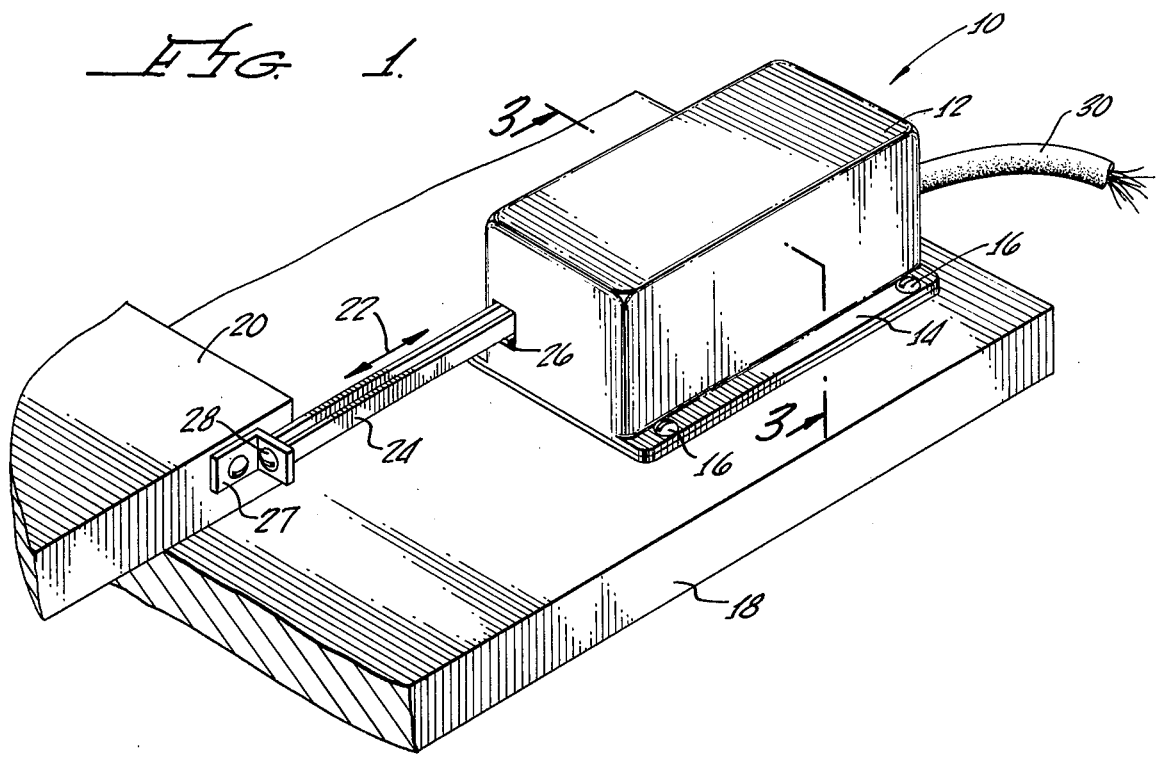
FIG. 1 is an overall perspective view of the linear shaft encoder of the present invention attached to a pair of relatively moving machine elements.

Referring initially to FIG. 1, the encoder 10 of the present invention is shown as including a chassis 12 housing the various components of the encoder 10 and typically including a flange 14 for rigid mechanical connection, as by a plurality of screws 16, to a first machine element 18. In a typical configuration, the machine element 18 is stationary and may be, for example, the main framework or base of a machine tool such as a milling tool or lathe. A second machine element 20, in a typical configuration, moves linearly along an axis shown by the arrows 22 relative the first machine element 18. The second moving element 20 may be, for example, a carriage or worktable operating along ways mounted on the first machine element 18. An elongate follower or connecting rod 24 passes through an aperture 26 in the chassis 12 and is connected to the moving machine element 20, as by a bracket 27 and screw 28, to move with the second machine tool element 20.

As is clear from FIG. 1, the encoder 10 of the present invention is a stand-alone device, that is, a device which may be purchased and attached to existing equipment without major modification of that equipment. It should be understood that when the screws 16 are attached to the stationary machine element 18, care is taken to maintain the longitudinal axis of the chassis 12, which is parallel to the follower rod 24, aligned in parallel with the motion axis 22 of the moving machine element 20. The encoder 10 of the present invention will, however, allow a certain degree of misalignment without generating errors in the output digital signal. This output digital signal, as well as power which must be supplied to the encoder 10, is conducted by means of a multiple conductor cable 30 passing through the chassis 12.

Figure 3:
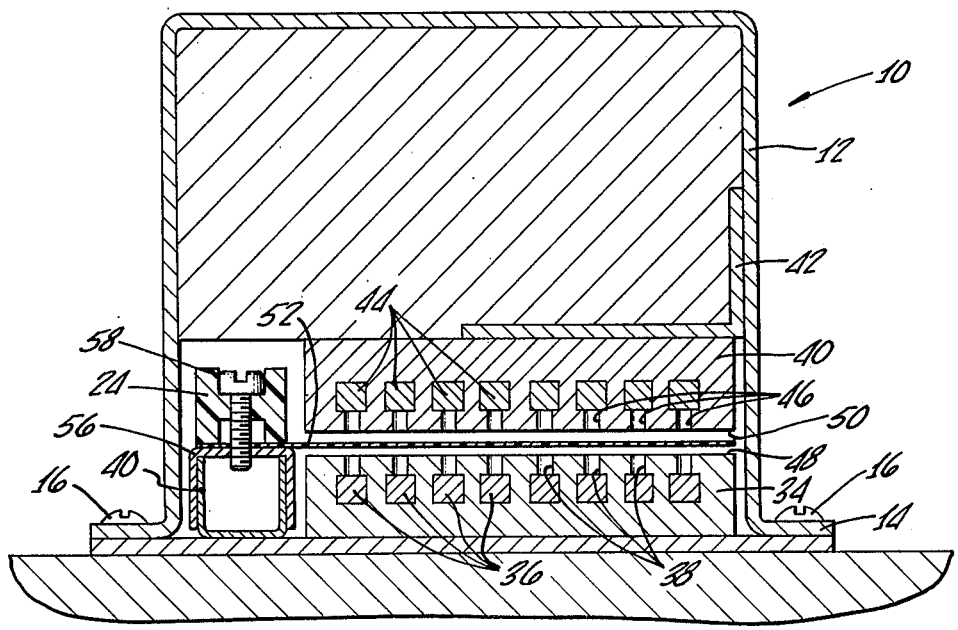
FIG. 3 is a sectional view of the encoder of the present invention taken along lines 3—3 of FIG. 1.
Figure 2:
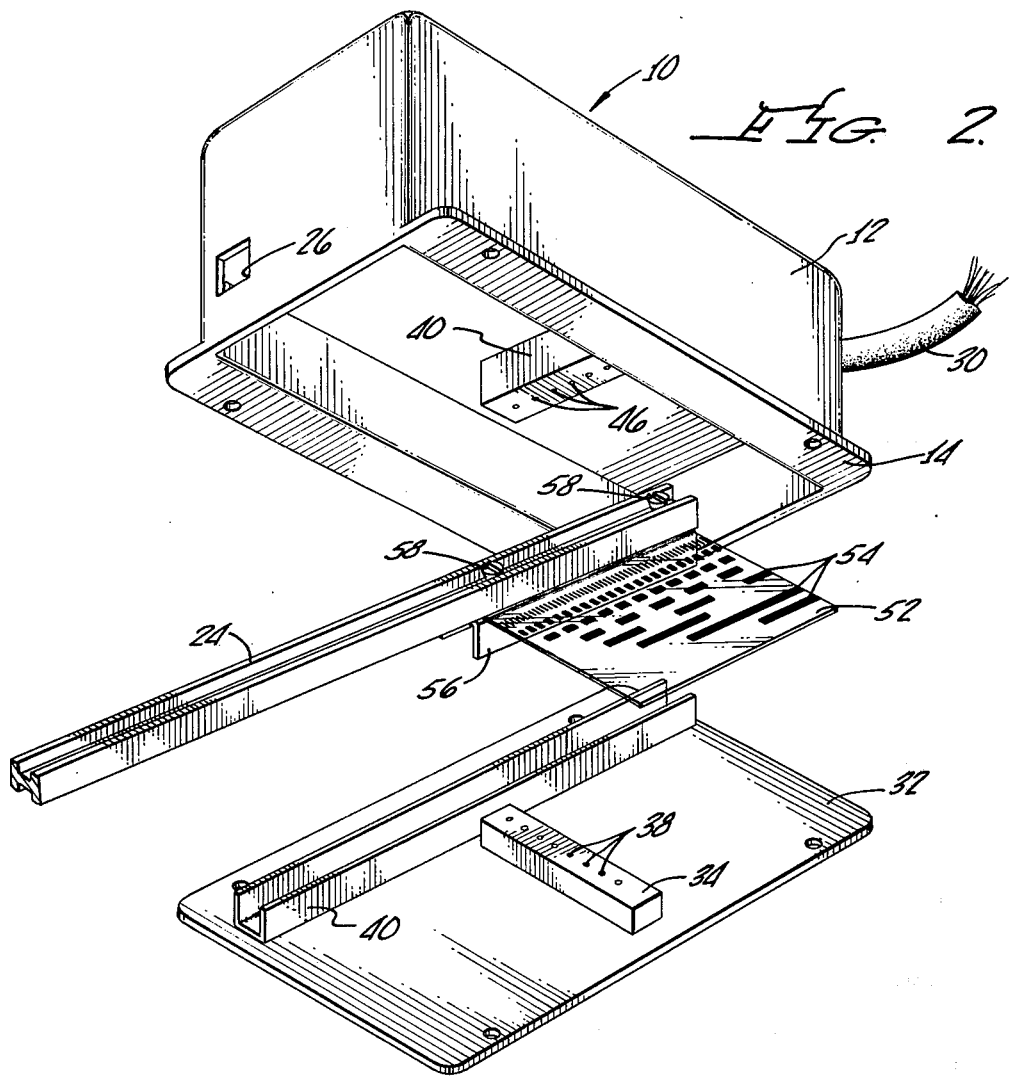
FIG. 2 is an exploded perspective view of the encoder of the present invention showing the various elements thereof.

Referring now to FIGS. 2 and 3, the structural details of the encoder 10 of the present invention will be described. The chassis 12 includes a cover incorporating the flange 14 and a bottom plate 32. These elements are preferably sealed together to exclude dust, ambient light or other contaminants from the inside of the chassis 12. The base plate 32 rigidly mounts a light-emitting-diode array 34 including plural light-emitting-diodes 36. These diodes, as best shown in FIG. 3, are individually positioned beneath plural apertures 38 in the array 34 so that light emanating from the diodes 36 is confined to a small vertical path, as viewed in FIG. 3, through the apertures 38.

The base plate 32 additionally rigidly supports a U-shaped track 40 constructed of rigid material such as brass. During assembly of the encoder 10, care is taken to align the track 40 and light-emitting-diode array 34 perpendicular to one another.

A phototransistor array 40 is rigidly mounted within the main body of the chassis 12, as by a bracket 42 which may be attached using any common hardware or adhesive to both the phototransistor array 40 and chassis 12. Alternatively, any common mounting technique may be used for supporting the photodiode array 34 and phototransistor array 40 on the chassis 12, so long as the relative position between these elements is maintained, and so long as the gap between the photodiode array 34 and phototransistor array 40 is kept uniform. The phototransistor array 40 is constructed in a manner similar to the photodiode array 34, with individual phototransistors 44 mounted adjacent plural apertures 46 such that each of the individual phototransistors 44 is responsive only to light entering the individual apertures 46.

As shown in FIG. 3, the individual phototransistors 36 and their associated apertures 38 are precisely aligned with the individual phototransistors 44 and their associated apertures 46 during assembly, such that each of the phototransistors 44 is responsive to light emanating from a single light-emitting-diode 36, this light passing through a path defined by the aligned apertures 38 and 46. A gap is maintained between the adjacent cases 48 and 50 of the arrays 34 and 40, respectively, this gap being narrow enough to assure that light from individual photodiodes 36 will only enter the aperture 46 of their associated phototransistor 44 and will not enter the apertures 46 of adjacent phototransistor 44. At the same time, this gap is sufficiently large to receive a reciprocating transparent coded mask 52.

The coded mask 52 is preferably constructed of relatively rigid plastic material so that it will be self-supporting in a cantilever manner to avoid continual abrasion of the mask 52 against the surfaces 48 and 50 of the arrays 34 and 40, respectively. The mask 50, as particularly shown in FIG. 2, includes a plurality of opaque areas 54 which are arranged in the form of a dimensional code, such as the Gray code, for selectively prohibiting the message of light between individual pairs of light-emitting-diodes 36 and phototransistors 44. Thus, in the typical embodiment shown in FIGS. 2 and 3, eight independent tracks of opaque coding are spaced along the mask 52 to conform precisely with the spacing between adjacent phototransistors 44 in the array 40. Each of these tracks is coded along the longitudinal axis of the chassis 12 to provide the digital information for a different bit in the code to be produced by the digital encoder 10.

The mask 52 is rigidly mounted between the follower rod 24 and a guide 56, these three elements being secured by a pair of screws 58, preferably threaded into the guide 56. During this assembly, the tracks 54 of opaque material on the mask 52 are precisely aligned so that they are parallel to the longitudinal axis of the follower rod 24 and guide 56. As shown particularly in FIG. 3, the guide 56 is formed as a U-shaped channel which is slightly larger than the U-shaped channel forming the track 40. The guide 56 is positioned over the track 40 such that the two U-shaped members form bearing surfaces to assure that, during translation of the rod 24, guide 56 and mask 52 along the axis 22, these elements are maintained in precise alignment with the track 40 and thus with the arrays 34 and 40. The guide 56 and track 40 are thus manufactured to a close tolerance such that misalignment between the mask 52 and the arrays 34 and 40 is prohibited.

To assure this alignment, the follower rod 24 is manufactured of semiresilient material, such as polyvinylchloride or other plastic, so that, while it will not compress along its longitudinal axis which would interfere with accurate linear measurements, the portion between the guide 56 and the bracket 27 will bend in a direction normal to this axis. Thus, in reference to FIG. 1, if the mounting of the flange 14 on the stationary machine element 18 is slightly out of alignment, movement of the machine element 20 will not be along an axis which is precisely parallel to the track 40 within the encoder 10. Nonetheless, the track 40 and associated guide 56 will maintain the mask 52 aligned between the arrays 34 and 40 regardless of this misalignment because of the flexibility of the member 24.

Figure 4:
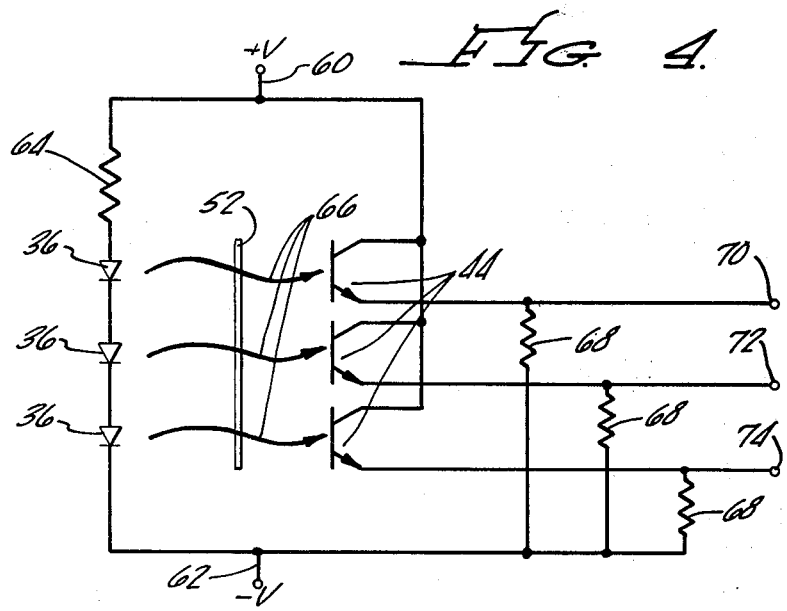
FIG. 4 is an electrical schematic showing the interconnection of the electrical components of the encoder of FIG. 1 for achieving a digital output signal indicative of the relative position of machine elements.

Referring now to FIG. 4, the electronic circuit utilized to power the light-emitting-diode array 34 and phototransistor array 40 and to sense the presence of opaque portions of the mask 52 between these elements will be described. The light-emitting-diodes 36 are typically series connected between a positive voltage bus 60 and a negative voltage bus 62. A current limiting resistor 64 is included in the series combination to protect the light-emitting-diodes 36 and to regulate their light output to thereby adjust the sensitivity of the photooptical system. The diodes 36 produce light which passes through the mask 52, as shown by the arrows 66, and falls on the plurality of phototransistors 44. Each of these phototransistors 44 has its collector connected to the positive voltage bus 60 and its emitter connected in parallel to plural biasing resistors 68 and plural output terminals 70 through 74. Each of the lines 60, 62, 70, 72 and 74, as well as the output sensing lines for the remaining phototransistors 44, are included in the multiple conductor cable 30 of FIGS. 1 and 2. Thus, the individual output terminals 70 through 74 each are maintained at the negative voltage of the bus 62 so long as the phototransistors 44 are nonconducting, as would occur when an opaque area 54 on the mask 52 is positioned between a particular light-emitting-diode 36 and phototransistor 44. When this opaque area moves from the light path, so that only the transparent mask 52 separates a particular light-emitting-diode 36 from its related phototransistor 44, the phototransistor 44 becomes conductive so that the individual output terminals 70 through 74 has a potential approximately equal to that of the positive voltage bus 60. Thus, by monitoring the voltage output on the sensing lines 70 through 74, an accurate multibit digital code signal may be monitored to determine at all times the relative position of the machine elements 18 and 20. As the element 20 moves, the code pattern on the output lines 70 through 74 will change. This digital information is particularly useful in equipment which is numerically controlled, for example, where the position of the movable element 20 is automatically set in accordance with the feedback signal available on the terminals 70 through 74.

As can be seen from FIG. 2 the digital coded pattern in the form of tracks 54 on the mask 52 are preferably arranged so that the track 54 having the finest gradation is closest to the guide 56. This track 54 with the finest gradations is most susceptible to alignment problems and it will be readily recognized that by positioning this track close to the guide 56 alignment difficulties are reduced since any misalignment is amplified with increased lateral distances from the rod 24 and track 56.

The primary feature of the present invention is the accurate alignment of the arrays 34 and 40 and mask 52 in a stand-alone linear encoder 10 through the use of the track 40 and guide 56 as well as a flexible follower rod 24, so that minor misalignment between the chassis 12 and moving element 20 do not generate erroneous output signals.

What is claimed is:

1. A self-contained linear digital encoder for measuring the relative linear dimension between a stationary machine element and a movable machine element, comprising:
   a housing for mounting on one of said stationary and movable machine elements;
   a photooptical system having plural photooptical sensors rigidly mounted within said housing;
   a multiple track coded mask cooperating with said photooptical system, each track thereof cooperating with one of said plural photooptical sensors for generating output digital signals indicative of the relative positions of said photooptical system and said mask;
   means mounted within said housing for guiding said coded mask for movement along a straight line path aligned relative said photooptical system; and
   a flexible rod connecting said coded mask to the other of said stationary and movable machine elements;
   said rod being sufficiently flexible to permit said guiding means to maintain alignment of said coded mask and said photooptical system regardless of small misalignment of said straight line path of said guiding means and the direction of motion of said moveable element.

2. A self-contained linear digital encoder as defined in claim 1 wherein said photooptical system rigidly mounted within said housing comprises a plurality of light emitting diodes aligned with a plurality of light sensitive transistors with a gap separating each light emitting diode-phototransistor pair and wherein said coded mask is positioned within said gap.

3. A self-contained linear digital encoder as defined in claim 1 wherein said means mounted within said housing for guiding said coded mask comprises:
   a U-shaped track rigidly mounted within said housing and aligned with said photooptical system;
   a U-shaped guide member reciprocating along said U-shaped track and aligned by said track, said U-shaped guide supporting said coded mask.

4. A self-contained linear encoder as defined in claim 3 wherein said flexible rod is rigidly attached at one end to said U-shaped guide member.

5. A self-contained linear digital encoder as defined in claim 1 wherein said flexible rod is constructed of plastic material which is susceptible to bending upon the application of lateral forces which are less than the forces which would be required for misaligning said guiding means.

6. A self-contained linear digital encoder as defined in claim 1 wherein said flexible rod is sufficiently flexible to permit said guiding means to maintain alignment of said coded mask regardless of misalignment of said housing relative said stationary machine element and said movable machine element.

7. A self-contained linear digital encoder as defined in claim 1 wherein said housing includes an aperture through which said flexible rod passes for connection to said other of said stationary and movable machine elements.

8. A linear encoder for addition to existing machinery as a self-contained unit for monitoring the relative position of a pair of elements of said machinery, comprising:
   a housing mounted on one of said pair of machine elements;
   a photooptical system mounted within said enclosure comprising:
      a plurality of light sources;
      a plurality of light sensors aligned with said plural light sources; and
      a multiple track coded mask movable relative said plural light sources and light sensors each track of said multiple track mask cooperating with an individual light source-light sensor pair; and
   a flexible rod connecting the other of said pair of machine elements to said coded mask said rod being sufficiently flexible to permit said coded mask to remain aligned with said photooptical system regardless of small misalignment of said housing on said one of said pair of machine elements.

9. A linear encoder as defined in claim 8 additionally comprising:
means mounted within said housing for guiding said coded mask for movement relative said housing along a predetermined axis.

10. A linear encoder as defined in claim 9 wherein said plurality of light sensors and said plurality of light sources are each positioned along parallel straight lines and wherein said predetermined axis is perpendicular to said parallel straight lines.

11. A linear encoder as defined in claim 8 wherein said coded mask includes plural tracks of coded digital opaque areas on a transparent backing, each of said tracks aligned with one of said plural light sensors and one of said plural light sources.

12. A linear encoder as defined in claim 11 wherein each of said plural tracks includes coded digital opaque areas of different gradations, the track closest said flexible rod having the finest gradations.

13. A linear encoder as defined in claim 8 additionally comprising:
means mounting said housing on said one of said pair of machine elements; and
means mounting said flexible rod on the other of said pair of machine elements, said housing mounting means and said rod mounting means being the sole means of mounting said linear encoder on said existing machinery.

14. A linear encoder for addition to existing machinery as a self-contained unit for monitoring the relative position of a pair of elements of said machinery, comprising:
an enclosure rigidly mounted on one of said pair of elements;
a photooptical system mounted on the enclosure, comprising:
a light source rigidly mounted to said enclosure;
plural light sensors, responsive to said light source, rigidly mounted to said enclosure; and
a multiple track coded mask movable between said light source and said plural light sensors, each track cooperating with one of said plural light sensors; a track rigidly mounted on said enclosure;
guide means movable along and aligned with respect to said track, said guide means supporting and aligning said coded mask; and
means connected to the other of said pair of elements for adjusting the position of said guide means along said track in response to changes in the relative position of said pair of machine elements said means permitting said guide means to align said coded mask regardless of small misalignment of said enclosure on said one of said pair of elements.

15. A linear encoder as defined in claim 14 wherein said means for adjusting operates regardless of misalignment between said track and said pair of machine elements.

16. A linear encoder as defined in claim 15 wherein said means for adjusting comprises an elongate rod connected at one end to said guide means and connected at the other end to one of said pair of machine elements, said elongate rod being constructed of flexible material.

17. A linear encoder for producing digital coded output signals in response to the relative movement and position of a pair of machine elements, comprising:
an enclosure mounted on one of said pair of machine elements;
a plurality of light sources mounted within said enclosure;
a plurality of light sensitive elements aligned with and responsive to said light sources and rigidly mounted within said enclosure;
a multiple track coded mask movable along an axis of said enclosure between said plural light sources and said plural light sensitive elements for interrupting light in a coded pattern, each track of said mask cooperating with one of said plural light sources and one of said plural light sensitive elements;
means connecting said coded mask to the other of said pair of machine elements; and
means for maintaining the alignment of said coded mask relative said axis of said enclosure during movement of said mask regardless of small misalignment of said enclosure on said one of said pair of machine elements.

18. A linear encoder for producing digital output signals in response to the relative movement and position of a pair of movable members comprising:
a base;
a plurality of light sources mounted on said base;
a plurality of light sensitive elements aligned with and responsive to said light sources and rigidly mounted on said base;
a multiple track coded mask linearly movable relative said base between said plural light sources and said plural light sensitive elements for interrupting light in a coded pattern, each track of said mask interrupting light between one of said plural light sources and one of said plural light sensitive elements;
means connecting said coded mask to one of said pair of movable members;
means for connecting said base to the other of said pair of movable members;
means for maintaining the alignment of said coded mask relative said base during movement of said mask regardless of small misalignment of said base on said other of said pair of movable members.

* * * * *